(12) United States Patent
Maigler et al.

(10) Patent No.: US 10,418,993 B2
(45) Date of Patent: Sep. 17, 2019

(54) OPERATING DEVICE COMPRISING A RECEIVER TO FACILITATE A SPATIALLY RESOLVED REGISTRATION OF RADIATION REFLECTED BY AN OPERATING PORTION OF SAID OPERATING DEVICE

(71) Applicant: DIEHL AKO STIFTUNG & CO. KG, Wangen (DE)

(72) Inventors: Andreas Maigler, Bad Waldsee (DE); Bruno Fuhge, Achberg (DE); Joachim Lyszus, Baindt (DE); Ralph Stohr, Leutkirch (DE); Thomas Frommelt, Munich (DE)

(73) Assignee: Diehl AKO Stiftung & Co. KG, Wangen (DE)

( * ) Notice: Subject to any disclaimer, the term of this patent is extended or adjusted under 35 U.S.C. 154(b) by 166 days.

(21) Appl. No.: 15/344,639

(22) Filed: Nov. 7, 2016

(65) Prior Publication Data

US 2017/0054441 A1 Feb. 23, 2017

Related U.S. Application Data

(63) Continuation of application No. PCT/EP2015/000846, filed on Apr. 23, 2015.

(30) Foreign Application Priority Data

May 13, 2014 (DE) .................. 10 2014 007 036

(51) Int. Cl.
*H03K 17/969* (2006.01)
*H03K 17/968* (2006.01)

(52) U.S. Cl.
CPC ......... *H03K 17/969* (2013.01); *H03K 17/968* (2013.01); *H03K 2217/94108* (2013.01)

(58) Field of Classification Search
CPC ............... H03K 17/969; H03K 17/968; H03K 2217/94108; H03K 17/965; H03K 17/96;
(Continued)

(56) References Cited

U.S. PATENT DOCUMENTS 3,580,082 A * 5/1971 Strack ................... G01L 9/0077
359/847
6,157,040 A * 12/2000 Bauer ..................... G01O 3/08
250/221

(Continued)

FOREIGN PATENT DOCUMENTS

CN 102576265 A 7/2012
DE 202006014856 U1 11/2006
(Continued)

*Primary Examiner* — Que Tan Le
*Assistant Examiner* — Jennifer D Bennett
(74) *Attorney, Agent, or Firm* — Laurence A. Greenberg; Werner H. Stemer; Ralph E. Locher

(57) ABSTRACT

An operating device, in particular for electronic household appliances, includes a cover plate with an operating portion, a transmitter for emitting electromagnetic radiation, a receiver for registering electromagnetic radiation, and control electronics for evaluating measurement signals produced by the receiver. The operating portion is at least partly elastically deformable and/or movable by an action of force from the direction of a user side of the cover plate and it at least partly reflects the radiation emitted by the transmitter. The receiver is disposed and/or configured in such a way that it facilitates a spatially resolved registration of the radiation reflected by the operating portion in such a way that the control electronics can detect an actuation of the operating portion in a manner dependent on a registration location of the reflected radiation. An electronic household appliance having at least one operating device is also provided.

15 Claims, 4 Drawing Sheets

(58) Field of Classification Search
CPC .......... H03K 2217/94102; H03K 2217/94111; H03K 2217/94112; G02B 26/00; G02B 6/3512; G02B 6/3516; G02B 6/3514; G02B 26/02

See application file for complete search history.

(56) References Cited

U.S. PATENT DOCUMENTS

| | | | |
|---|---|---|---|
| 7,176,905 B2* | 2/2007 | Baharav | G06F 3/0426 178/18.09 |
| 9,190,999 B2 | 11/2015 | Arnold | |
| 2005/0212774 A1* | 9/2005 | Ho | G06F 3/0416 345/173 |
| 2007/0109152 A1 | 5/2007 | Wald et al. | |
| 2007/0182717 A1* | 8/2007 | Arnold | G01V 8/12 345/170 |
| 2008/0007540 A1* | 1/2008 | Ostergaard | G06F 3/0421 345/176 |
| 2010/0277431 A1* | 11/2010 | Klinghult | G06F 3/0412 345/174 |
| 2010/0302196 A1 | 12/2010 | Han et al. | |
| 2011/0187204 A1 | 8/2011 | Lacey et al. | |
| 2013/0076629 A1* | 3/2013 | Lin | G06F 3/0317 345/166 |

FOREIGN PATENT DOCUMENTS

| | | | |
|---|---|---|---|
| DE | 202006014856 | * | 12/2006 |
| DE | 102006004979 | B4 | 5/2012 |
| DE | 102011121897 | A1 | 6/2013 |
| DE | 102012203005 | B4 | 2/2014 |
| EP | 2529484 | B1 | 12/2013 |
| WO | 2010141380 | A2 | 12/2010 |

* cited by examiner

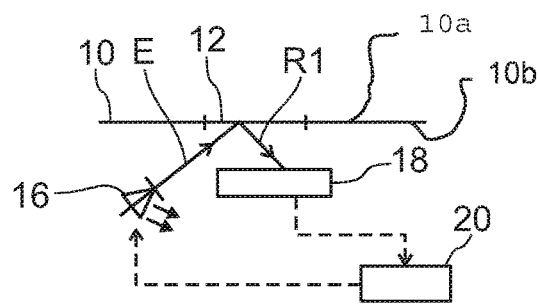
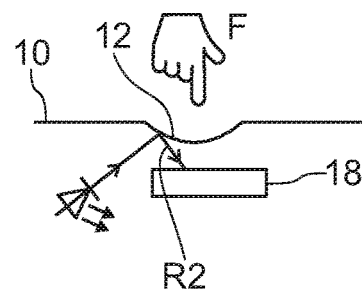
Fig. 1A  Fig. 1B
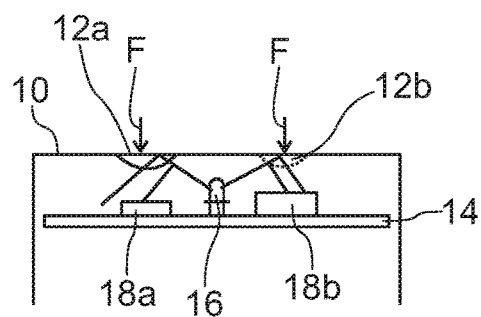
Fig. 2

OPERATING DEVICE COMPRISING A RECEIVER TO FACILITATE A SPATIALLY RESOLVED REGISTRATION OF RADIATION REFLECTED BY AN OPERATING PORTION OF SAID OPERATING DEVICE

CROSS-REFERENCE TO RELATED APPLICATION

This is a continuation application, under 35 U.S.C. § 120, of copending International Application PCT/EP2015/000846, filed Apr. 23, 2015, which designated the United States; this application also claims the priority, under 35 U.S.C. § 119, of German Patent Application DE 10 2014 007 036.0, filed May 13, 2014; the prior applications are herewith incorporated by reference in their entirety.

BACKGROUND OF THE INVENTION

Field of the Invention

The present invention relates to an operating device, in particular an operating device for electronic household appliances. The invention also relates to an electronic household appliance having the operating device.

Different types of operating elements with different functionalities are known for operating devices. By way of example, in the case of operating elements embodied as pushbuttons, it is possible to differentiate between contact and/or proximity sensitive pushbuttons (so called "touch control") and pushbuttons actuated by the action of force. Such pushbuttons are each realizable with various constructions and functionalities.

In that context, capacitive pushbuttons (see, for example, German Patent Application DE 10 2011 121 897 A1), inductive pushbuttons (see, for example, European Patent EP 2 529 484 B1, corresponding to U.S. Patent Application US 2011/0187204), and piezoelectric pushbuttons, in particular, are known in addition to those with a mechanical actuation element in the case of pushbuttons actuated by the action of force. In general, those specific pushbuttons require high manufacturing and assembly accuracy with small tolerance ranges.

Contact and proximity sensitive pushbuttons often have a sensor system based on a capacitive or inductive functional principle. In the case of metallic operating faceplates, those pushbuttons then need to be provided with additional measures for electrical insulation. Other contact and/or proximity sensitive pushbuttons with an optical sensor system (see, for example, German Patent DE 10 2006 004 979 B4, corresponding to U.S. Pat. No. 9,190,999) require an operating faceplate made of a transparent material or with perforations, as a matter of principle.

SUMMARY OF THE INVENTION

It is accordingly an object of the invention to provide an operating device, in particular for an electronic household appliance, and an electronic household appliance having the operating device, which overcome the hereinafore-mentioned disadvantages of the heretofore-known devices and appliances of this general type and which provide a pushbutton actuated by the action of force, which has a reliable functionality.

With the foregoing and other objects in view there is provided, in accordance with the invention, an operating device, in particular for an electronic household appliance, comprising a cover plate with a user side facing a user, the cover plate having an operating portion; at least one transmitter for emitting electromagnetic radiation and at least one receiver for registering electromagnetic radiation; and control electronics for evaluating measurement signals produced by the at least one receiver. The operating portion of the cover plate is configured in such a way that it is at least partly elastically deformable and/or movable by an action of force from the direction of the user side of the cover plate and that it at least partly reflects the radiation emitted by the at least one transmitter. Moreover, the at least one receiver is disposed and/or configured in such a way that it facilitates a spatially resolved registration of the radiation reflected by the operating portion. The control electronics can then detect an actuation of the operating portion in a manner dependent on a registration location of the reflected radiation.

In the operating device according to the invention, minimal deformations or travels of the operating portion are sufficient to be able to register an actuation by the user since very different deflections of electromagnetic radiation are already effected in the case of very small changes of the reflection location at the operating portion. The actuation of the operating portion can therefore be identified very reliably by the control electronics.

Moreover, the tolerances during manufacturing and assembly of the components in the case of an operating device with such a construction may be increased in comparison with conventional pushbuttons actuated by the action of force with a capacitive, inductive or piezoelectric functionality. This is achieved by the very different registration location on the receiver which is already effected in the case of minimal changes in the reflection location at the operating portion. This can also reduce the susceptibility to errors and thus increase the reliability of the operating device.

The operating device of the invention facilitates a retrospective adaptation of the control electronics to the mechanical components such as, in particular, the cover plate with the operating portion.

Since the registration of a relative change in the registration location of the reflected radiation at the receiver (in contrast to the registration of an absolute value) suffices for detecting an actuation of the operating portion, it is also possible to dispense with a calibration process in the operating device according to the invention.

In this context, the cover plate may be manufactured from any material, with any dimensions and any construction. The cover plate is preferably an operating faceplate, for example of an electronic household appliance.

Preferably, the operating portion has an integral or one-piece embodiment with the cover plate, it is inserted as a separate component into the cover plate or it is connected as a separate component to the cover plate. For the user, the operating portion defines the operating element of the operating device which needs to be pressed for actuation. Preferably, the operating portion is marked for the user, preferably by a special shaping of the user side thereof (haptic labeling), a label with colors and/or symbols, backlighting, an identifiable delimitation from the remainder of the cover plate and the like.

The operating portion is at least partly elastically deformable and/or movable by an action of force from the direction of the user side of the cover plate. The elastic deformability is preferably achieved by a specific material selection and/or specific dimensioning of the operating portion. Preferably, the elastic movability can be realized by a resilient bearing of the operating portion in a perforation in the cover plate.

The electromagnetic radiation which is emitted by the at least one transmitter and registered by the at least one receiver is preferably optical radiation, preferably in the visible or infrared wavelength range. With respect to the electromagnetic radiation registrable thereby, the at least one receiver is tuned to the electromagnetic radiation emitted by the at least one transmitter. Preferably, the respective wavelength ranges substantially correspond or have a significant overlap region.

The at least one transmitter is preferably a light-emitting diode (LED), a laser diode, an incandescent lamp, a halogen lamp or the like. However, the at least one transmitter can also be realized by ambient light which can reach the rear side of the operating portion through an appropriate opening, for example in the appliance housing or in the cover plate.

The at least one receiver facilitates a spatially resolved registration of the reflected radiation. Preferably, the at least one receiver is exactly one receiver with a spatially resolving functionality or the at least one receiver is formed by a plurality of receivers disposed substantially next to one another. Accordingly, the at least one receiver is preferably selected from a CCD chip, an active pixel sensor, photodiodes, phototransistors, ambient light sensors and the like.

The operating portion is configured in such a way that it is able to at least partly reflect the radiation emitted by the at least one transmitter. This reflection behavior of the operating portion is preferably achieved by a specific material selection of the operating portion, by a specific surface structure of the rear side of the operating portion, by a specific surface treatment (preferably a coating, etc.) of the rear side of the operating portion or the like.

Despite its optical functionality, the operating device of the invention can advantageously also be used in the case of cover plates which are substantially opaque to the respective electromagnetic radiation. In particular, the operating portion may also be configured to be substantially opaque to the radiation emitted by the at least one transmitter.

In addition to the operating portion which is actuatable by an action of force and optically evaluable, the operating device may also have further operating elements with other functionalities. In this case, use can be made, in particular, of other pushbuttons and contact and/or proximity sensitive buttons.

In a preferred configuration of the invention, the cover plate has a plurality of operating portions, each of which is configured to be elastically deformable and/or movable by an action of force from the direction of the user side of the cover plate. Therefore, the operating device has a plurality of operating elements which are actuatable by a user.

In this case, preferably, at least one common transmitter and/or at least one common receiver may be provided for a plurality of (i.e. for at least two or even all of) the plurality of operating portions.

In one configuration of the invention, provision is moreover made for at least one optical waveguide for transporting the radiation emitted by the at least one transmitter to the operating portion, to one of the plurality of operating portions or to at least two of the plurality of operating portions. This configuration may be facilitated in a compact manner in the region of the operating portion or the operating portions since the at least one transmitter may be placed at a different location. The at least one optical waveguide can preferably transport the radiation to an operating portion or—by way of a plurality of decoupling points—to a plurality of operating portions.

In one configuration of the invention, a plurality of receivers, which are assigned to various operating portions, and/or a plurality of transmitters, which are assigned to various operating portions, may be operated in a clocked manner by the control electronics. In this manner, it may be possible to differentiate actuations of different operating portions from one another, despite a common use of a transmitter or receiver.

In one configuration of the invention, at least two of the plurality of operating portions may have at least one reflector for reflecting the radiation emitted by the at least one transmitter, wherein the reflectors assigned to various operating portions have different angles of reflection. In this configuration, transmitters or receivers may advantageously be used together for a plurality of operating portions.

In one configuration of the invention, at least one lens may be provided. The lens is assigned together to at least two of the plurality of operating portions and deflects the radiation reflected by various operating portions to a different extent. In this configuration too, transmitters or receivers may advantageously be used together for a plurality of operating portions.

With the objects of the invention in view, there is concomitantly provided an electronic household appliance comprising at least one above-described operating device of the invention.

The electronic household appliance is preferably a laundry treatment appliance (washing machine, tumble dryer, etc.), a dishwasher, a cooling and/or freezing appliance (refrigerator, freezer, etc.), a hob or cooktop, an oven, a microwave oven, an extractor or exhaust fan or the like.

Other features which are considered as characteristic for the invention are set forth in the appended claims.

Although the invention is illustrated and described herein as embodied in an operating device, in particular for an electronic household appliance, and an electronic household appliance having the operating device, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE SEVERAL VIEWS OF THE DRAWING

FIGS. 1A and 1B are very simplified schematic and block diagrams illustrating the functional principle of an operating device in accordance with a first embodiment variant of the invention;

FIG. 2 is a diagrammatic, sectional view of an operating device including a plurality of operating portions in accordance with one exemplary embodiment of the invention;

DETAILED DESCRIPTION OF THE INVENTION

Figure 3:
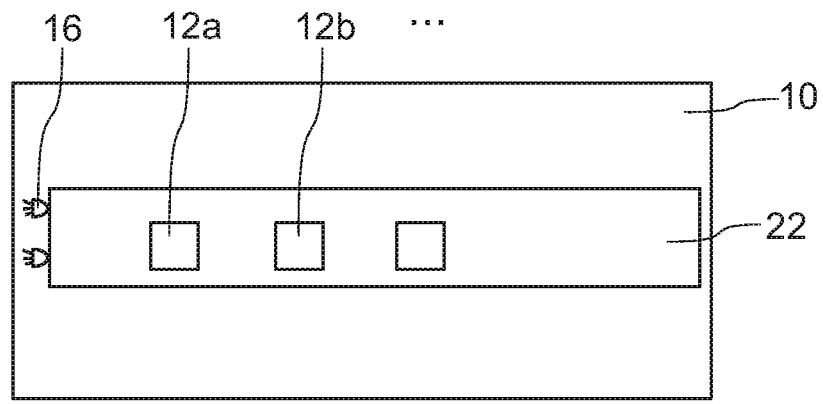
FIG. 3 is a top-plan view of an operating device including a plurality of operating portions in accordance with a further exemplary embodiment of the invention.

Referring now in detail to the figures of the drawings, showing preferred, non-restrictive exemplary embodiments of the invention, and first, particularly, to FIG. 1 thereof, there is initially seen an illustration of a basic functionality of an operating device in accordance with a first embodiment variant of the invention. In this case, a state without actuation by a user is depicted in a partial illustration in FIG. 1A, while a state with actuation by the user is depicted in a partial illustration in FIG. 1B.

The operating device includes a cover plate 10, for example in the form of an operating faceplate of e.g. an apparatus or an electronic household appliance. This cover plate 10 has a user side 10a (at the top in FIG. 1), facing a user, which corresponds to the outer side of the operating faceplate or of the appliance, and a rear side 10b (at the bottom in FIG. 1), facing away from a user, which corresponds to the inner side of the operating faceplate or of the appliance. By way of example, the cover plate 10 is manufactured from a plastic or metal.

This cover plate 10 has at least one operating portion 12 that defines an operating element for the user which may be actuated by the user. The operating portion 12 is integrated into or is formed as one piece with the cover plate 10 or it has an integral embodiment therewith or it is inserted therein as a separate component and optionally connected therewith. As the comparison of the partial illustrations in FIGS. 1A and 1B shows, the operating portion 12 has an elastically deformable configuration provided by an action of force F from the direction of the user side 10a, for example by a finger of the user. That is to say, after the action of the force F is completed, the operating portion 12 returns into its initial state, which is indicated in the partial illustration in FIG. 1A.

The operating portion 12 is preferably labeled for the user, so that the user can find it more easily and is able to identify the functionality thereof. To this end, the operating portion 12, or the outside thereof, may itself be labeled or the cover plate 10 may be labeled in the vicinity of the operating portion 12. By way of example, labeling is brought about optically by colors and/or symbols, haptically by surface structures, electrically by backlighting or signal lamps, or the like.

The operating device furthermore has at least one transmitter 16, for example in the form of an LED, and at least one receiver 18, for example in the form of a CCD chip. The transmitter 16 emits electromagnetic radiation, preferably light in the visible or infrared wavelength range, and the receiver 18 registers electromagnetic radiation of the same wavelength range. In this case, the at least one receiver 18 is configured to register radiation with spatial resolution. This means that a single receiver has such a capability (e.g. CCD chip, sensor array, etc.) or a plurality of receivers (e.g. photodiodes, phototransistors, etc.) are disposed next to one another and evaluated together.

The at least one transmitter 16 and the at least one receiver 18 are connected to control electronics 20. By way of example, the control electronics 20 have a microcontroller or are formed by a microcontroller. The control electronics 20 actuate the at least one transmitter 16, i.e. the control electronics only switch the transmitter on and off in the simplest case or operate the transmitter e.g. in a clocked manner. Moreover, the control electronics 20 evaluate measurement signals generated by the at least one receiver 18 in order to be able to detect an actuation of the operating portion 12 by a user.

As elucidated in the partial illustrations in FIGS. 1A and 1B, radiation E emitted by the transmitter 16 is incident on the operating portion 12, or the rear side thereof, and reflected there. Radiation R1, R2 reflected at the operating portion 12 is then incident on the receiver 18 and registered by the latter. The receiver 18 generates corresponding measurement signals which are evaluated by the control electronics 20. In the initial state shown in the partial illustration in FIG. 1A, i.e. without actuation of the operating portion 12 by the user, the operating portion 12 is in its non-deformed initial state and reflects the radiation R1 to the receiver 18. In the actuation state shown in the partial illustration in FIG. 1B, i.e. in the case of the user exerting a force F onto the operating portion 12, the operating portion 12 is deformed and reflects the radiation R2 to the receiver 18. A comparison between the two partial illustrations in FIGS. 1A and 1B shows that there is a very clear change in the registration location of the reflected radiation R2, even in the case of a relatively small deformation of the operating portion 12. This relative change of the registration location is registered by the spatially resolving receiver 18, and therefore the control electronics 20 can register an actuation of the operating portion 12.

The registration of a relative change of the registration location at the receiver 18 is sufficient for the evaluation by the control electronics 20. Absolute measurement values for the change are not required, but they may likewise be registered and evaluated in specific embodiments. The registration of only the relative change also minimizes the requirements on the dimensional and position accuracies of the individual components or increases the allowed tolerance ranges during manufacturing and during assembly of these components.

FIG. 2 shows a first exemplary embodiment of an operating device according to the invention, which works according to the basic principle of FIG. 1 explained above.

As is indicated in FIG. 2, the transmitters 16 and the receivers 18 are disposed on a carrier plate 14, for example in the form of a printed circuit board. By way of example, the carrier plate 14 is disposed substantially parallel to and behind the cover plate 10 at a small distance. The control electronics 20 may likewise be disposed on this carrier plate 14.

In this exemplary embodiment, the operating device has two operating elements, i.e. the cover plate 10 is equipped with two operating portions 12a, 12b. On one hand, a common transmitter 16 is provided for both operating portions 12a, 12b, and the transmitter emits radiation in the direction of both operating portions 12a, 12b. On the other hand, at least one (dedicated) receiver 18a, 18b (18n) is provided for each one of the two operating portions 12a, 12b.

In a development of the exemplary embodiment depicted in FIG. 2, provision can naturally also be made, on one hand, for more than two operating portions 12a, 12b in the cover plate 10 which are irradiated by a common transmitter 16. On the other hand, the exemplary embodiment of FIG. 2 can also be reduced to a single operating portion 12.

FIG. 3 shows a second exemplary embodiment of an operating device according to the invention, which works according to the aforementioned basic principle.

In this exemplary embodiment, the at least one transmitter 16 is disposed at a distance from the plurality of operating portions 12a, 12b, . . . of the cover plate 10. Provision is made for an optical waveguide 22 with a suitable form and dimensions for transporting the radiation emitted by the at least one transmitter 16 to the individual operating portions 12a, 12b . . . .

The radiation coupled into the optical waveguide 22 by the at least one transmitter 16 may be decoupled from the optical waveguide 22 in e.g. at the region of the operating portions 12a, 12b, . . . . The radiation reflected at the operating portions 12 can then be registered by one or more receivers 18. By way of example, the change in the registration location when actuating the operating portions 12a, 12b, . . . is effected in a direction across the longitudinal extent of the optical waveguide 22 in such a way that, in the top view of FIG. 3, the receiver or receivers 18a, 18b, . . . may be positioned next to the optical waveguide 22.

Figure 4:
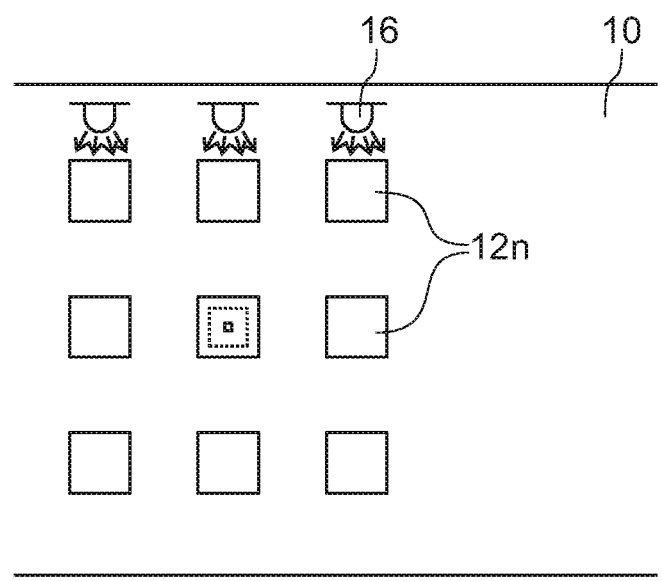
FIG. 4 is a top-plan view of an operating device including a plurality of operating portions in accordance with a further exemplary embodiment of the invention.

FIG. 4 shows a third exemplary embodiment of an operating device according to the invention, which works according to the aforementioned basic principle.

In this exemplary embodiment, the cover plate 10 has a field of n operating portions 12a, . . . 12n, which are disposed e.g. in a matrix-like manner (see FIG. 4) or along a line. At least one transmitter 16 is provided in FIG. 4 for each row (or, more generally, each subgroup) of operating portions 12n. Optionally, the plurality of transmitters 16 for the various rows or subgroups of operating portions 12n can also be operated in a clocked manner by the control electronics 20.

Further exemplary embodiments are described below on the basis of FIGS. 5 and 6, in which the numbers of transmitters and receivers can be kept as small as possible, despite a plurality of operating portions 12n.

Figure 5:
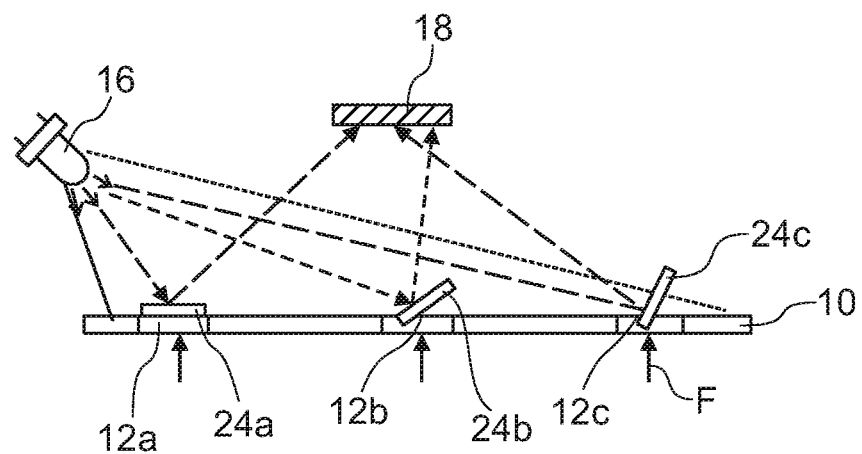
FIG. 5 is a sectional view of an operating device including a plurality of operating portions in accordance with an even further exemplary embodiment of the invention.

In the exemplary embodiment of FIG. 5, a reflector 24a, 24b, (24n) . . . is disposed in each case at the rear side of a plurality of operating portions 12a, 12b, . . . . The reflectors 24a, 24b, . . . of the various operating portions 12a, 12b, . . . are irradiated by a common transmitter 16.

The reflectors 24a, 24b, . . . of the various operating portions 12a, 12b, . . . have different configurations than one another and/or are aligned differently in such a way that they have different angles of reflection. As a result, the radiation emitted by the transmitter 16 is reflected at the reflectors 24a, 24b, . . . onto a common spatially resolving receiver 18 (or, alternatively, a group of receivers), despite their spaced apart positions. In this case, the reflected radiation for the various operating portions 12a, 12b, . . . migrate over different registration location regions of the receiver 18, which are optionally actuated or evaluated in a clocked manner by the control electronics 20 in such a way that the actuations of the various operating portions 12a, 12b, . . . can be differentiated from one another.

Figure 6:
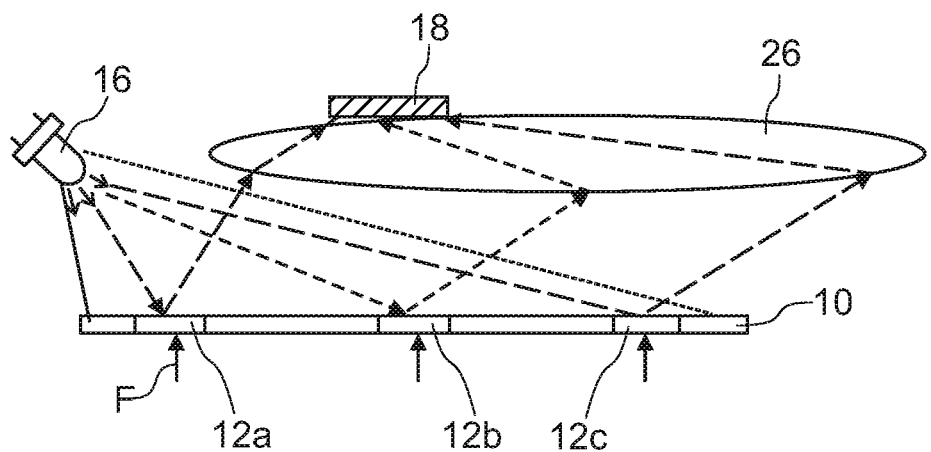
FIG. 6 is a sectional view of an operating device including a plurality of operating portions in accordance with an even further exemplary embodiment of the invention.

In the exemplary embodiment of FIG. 6, a lens 26 is disposed in the beam path between the plurality of operating portions 12a, 12b, . . . and the common receiver 18 (or, alternatively, a group of receivers). This lens 26 is configured and disposed in such a way that the radiation reflected by the various operating portions 12a, 12b, . . . are deflected to a different extent. As a result, the radiation reflected by the operating portions 12a, 12b, . . . are focused onto the common receiver 18 with the aid of the lens 26, despite the spaced apart positions thereof on the cover plate 10. In this case, the radiation reflected by the various operating portions 12a, 12b, . . . migrates over different registration location regions of the receiver 18, which are optionally actuated or evaluated in a clocked manner by the control electronics 20 in such a way that the actuations of the various operating portions 12a, 12b, . . . can be differentiated from one another.

The basic functionality of an operating device in accordance with the second embodiment variant will now be explained in more detail on the basis of FIGS. 7A and 7B. In this case, the partial illustration in FIG. 7A shows the state without actuation by the user, while the partial illustration in FIG. 7B depicts the state in the case of actuation by the user.

Figure 7A:
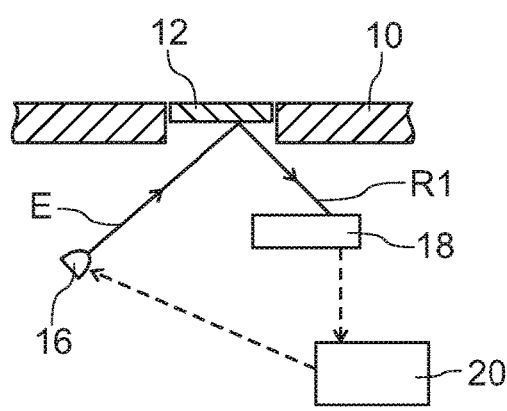
FIGS. 7A and 7B are very simplified, fragmentary, sectional views illustrating the functional principle of an operating device in accordance with a second embodiment variant of the invention.
Figure 7B:
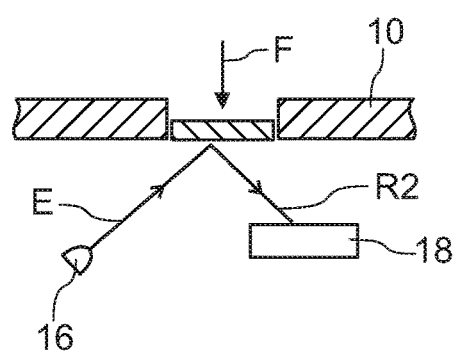

In FIGS. 7A and 7B, the same or corresponding components are denoted by the same reference signs as in FIGS. 1 to 6. Furthermore, the exemplary embodiments of FIGS. 2 to 6, described above, can be transferred to the embodiment variant of FIGS. 7A and 7B without difficulty by a person skilled in the art.

The second embodiment variant of FIGS. 7A and 7B differs from the first embodiment variant of FIG. 1 by the configuration of the operating portion 12 in the cover plate 10. While the operating portion 12 in FIGS. 1A and 1B has an elastically deformable configuration provided by an action of force F by a user, the operating portion in the embodiment variant of FIGS. 7A and 7B is movable by an action of force F by a user.

To this end, the operating portion 12 is preferably manufactured as a separate component from the cover plate 10 and mounted in a movable manner in a recess or perforation in the cover plate 10. In the case of an actuation of the operating portion 12, the latter is pressed into the cover plate 10 and displaced inwardly, as elucidated in the partial illustration in FIG. 7B. After the action of force F has been terminated, the operating portion 12 returns into its initial position, which is indicated in the partial illustration in FIG. 7A. By way of example, this is carried out with the aid of an elastic spring element, which pretensions the operating portion in its initial position.

As is elucidated in the partial illustrations in FIGS. 7A and 7B, the radiation E emitted by the transmitter 16 is incident on the operating portion 12, or the rear side thereof, and reflected there. The radiation R1, R2 reflected at the operating portion 12 is then incident on the receiver 18 and registered by the latter. The receiver generates appropriate measurement signals which are evaluated by the control electronics 20. In the initial state in the partial view of FIG. 7A, i.e. without actuation of the operating portion 12 by the user, the operating portion 12 is situated in its initial position and reflects the radiation R1 to the receiver 18. In the case of an action of force F by the user on the operating portion 12, the operating portion 12 is shifted inwardly and reflects the radiation R2 to the receiver 18. A comparison between the two partial illustrations in FIGS. 7A and 7B shows that there is a very clear change in the registration location of the reflected radiation R2, even in the case of a relatively small travel of the operating portion 12. This relative change in the registration location is registered by the spatially resolving receiver 18 in such a way that the control electronics 20 can register an actuation of the operating portion 12.

Optionally, the rear side of the operating portion 12 may also deviate from the planar form in order to amplify the effect of the change in the registration location.

Otherwise, the second embodiment variant of FIGS. 7A and 7B corresponds to the first embodiment variant described above on the basis of FIGS. 1A and 1B.

Furthermore, the two embodiment variants of FIGS. 1A and 1B and FIGS. 7A and 7B may be combined with one another. Then, the operating portion 12 is both slightly deformed and moved a little in the case of an action of force by a user.

The invention claimed is:

1. An operating device for an apparatus or an electronic household appliance, the operating device comprising:
   at least one transmitter for emitting electromagnetic radiation;
   a cover plate having a user side facing a user and a rear side facing away from the user, said cover plate having an operating portion configured to be at least one of at least partly elastically deformable or movable by an action of a force from a direction of said user side of said cover plate, said operating portion being configured to at least partly reflect the electromagnetic radiation emitted by said at least one transmitter directly from said rear side of said cover plate at an angle of reflection being dependent on a location of application of the force;
   at least one receiver being disposed at a fixed distance from said at least one transmitter and being at least one of disposed or configured to facilitate a spatially resolved registration of the electromagnetic radiation reflected by said operating portion; and
   control electronics for evaluating measurement signals produced by said at least one receiver and for detecting an actuation of said operating portion in a manner dependent on a registration location of the reflected electromagnetic radiation.

2. The operating device according to claim 1, wherein said operating portion is configured to be substantially opaque to the electromagnetic radiation emitted by said at least one transmitter.

3. The operating device according to claim 1, wherein said operating portion is one of a plurality of operating portions of said cover plate, and each of said operating portions is configured to be at least one of elastically deformable or movable by an action of a force from the direction of said user side of said cover plate.

4. The operating device according to claim 3, wherein said at least one transmitter is associated with at least two of said plurality of operating portions.

5. The operating device according to claim 3, wherein said at least one receiver is associated with at least two of said plurality of operating portions.

6. The operating device according to claim 3, which further comprises at least one optical waveguide for transporting the electromagnetic radiation emitted by said at least one transmitter to one or to at least two or to said plurality of operating portions.

7. The operating device according to claim 3, wherein said at least one receiver is one of a plurality of receivers each being associated with a different one of said operating portions and being operated in a clocked manner by said control electronics.

8. The operating device according to claim 3, wherein said at least one transmitter is one of a plurality of transmitters each being associated with a different one of said operating portions and being operated in a clocked manner by said control electronics.

9. The operating device according to claim 3, wherein at least two of said plurality of operating portions each have at least one respective reflector for reflecting the electromagnetic radiation emitted by said at least one transmitter, and each of said reflectors associated with a different one of said operating portions have a different angle of reflection.

10. The operating device according to claim 3, which further comprises at least one lens being associated with at least two of said plurality of operating portions and deflecting the electromagnetic radiation reflected by different operating portions to a different extent.

11. An electronic household appliance, comprising at least one operating device according to claim 1.

12. The operating device according to claim 1, wherein said action of said force deforms said rear side of said cover plate into an open space below said rear side of said cover plate.

13. The operating device according to claim 1, wherein said at least one receiver is configured to continuously detect the electromagnetic radiation in a deformed and a non-deformed state of said cover plate.

14. The operating device according to claim 1, wherein said user side and said rear side of said cover plate are planar at said operating portion.

15. The operating device according to claim 1, wherein said cover plate including said user side and said rear side is formed in one piece at said operating portion.

* * * * *